United States Patent [19]
Liberman

[11] Patent Number: 4,769,615
[45] Date of Patent: Sep. 6, 1988

[54] POWER SUPPLY AND SIGNAL AMPLIFIER AND METHOD OF OPERATION

[76] Inventor: Zvie Liberman, c/o Talk-A-Phone Co., 5013 N. Kedzie Ave., Chicago, Ill. 60625

[21] Appl. No.: 120,713

[22] Filed: Nov. 13, 1987

Related U.S. Application Data

[63] Continuation of Ser. No. 20,239, Mar. 3, 1987, abandoned, which is a continuation of Ser. No. 904,790, Sep. 4, 1986, abandoned, which is a continuation of Ser. No. 833,419, Feb. 21, 1986, abandoned, which is a continuation of Ser. No. 776,087, Sep. 13, 1985, abandoned, which is a continuation of Ser. No. 518,816, Aug. 1, 1983, abandoned.

[51] Int. Cl.$^4$ ............................................. H03F 3/45
[52] U.S. Cl. ..................................... 330/261; 330/297
[58] Field of Search ............... 330/199, 202, 203, 261, 330/297

[56] References Cited
U.S. PATENT DOCUMENTS 4,103,231 7/1978 Nemcek, Sr. .................... 330/203 X

FOREIGN PATENT DOCUMENTS 1542321 3/1979 United Kingdom ................ 330/297

OTHER PUBLICATIONS

"LM10/LM10B(L)/LM10C(L) Op AMP and Voltage Reference", Publication of National Semiconductor, Feb. 1982, 16 sheets.

Bursky, "Micropower Bipolar Op AMP Works With Supply as Low as 1 V", *Electronic Design 2*, vol. 27, No. 2, Jan. 18, 1979, p. 113.

*Primary Examiner*—James B. Mullins
*Attorney, Agent, or Firm*—Wood, Dalton, Phillips, Mason & Rowe

[57] ABSTRACT

A power supply for an operational transconductance amplifier has positive and negative terminals to which the positive and negative power terminals of the amplifier are connected. A stable reference potential is established with respect to one of the power supply terminals. The signal input and output circuits connected with the amplifier are referred to the stable reference potential and the amplifier is operated to maintain the output signal at a level such that the power supply noise does not affect the output signal.

10 Claims, 2 Drawing Sheets

POWER SUPPLY AND SIGNAL AMPLIFIER AND METHOD OF OPERATION

This application is a continuation of application Ser. No. 020,239, filed Mar. 3, 1987, now abandoned, which was a continuation of Ser. No. 904,790, filed Sept. 4, 1986, now abandoned, which was a continuation of Ser. No. 833,419, filed Feb. 21, 1986, now abandoned, which was a continuation of Ser. No. 776,087, filed Sept. 13, 1985, now abandoned, which was a continuation of Ser. No. 518,816, filed Aug. 1, 1983, now abandoned.

FIELD OF THE INVENTION

This invention relates to a signal amplifier and power supply, and a method of operation, for achieving a high signal and noise ratio.

BACKGROUND OF THE INVENTION

One criteria for maintaining a high signal to noise ratio in an electronic amplifier is the quality of the power supply. Ripple, transients or other instability in a power supply are reflected in the output signal. This is particularly a problem with an operational amplifier which utilizes a bipolar power supply as both the positive and negative sections of the power supply require regulation.

SUMMARY OF THE INVENTION

In accordance with the invention, a power supply having positive and negative terminals with nominal voltage V1 therebetween and subject to variations or ripple of ±V2, where V2<V1, includes means establishing a reference potential which is stable or fixed with respect to one of the supply terminals. An amplifier has power terminals connected with the positive and negative power supply terminals and a signal output circuit which is referred to the reference voltage. The amplitude of the amplified output signal is maintained at a level less than V1-V2 so that no power supply noise is coupled into the output signal.

Another feature is that the amplifier is an operational amplifier and preferably an operational transconductance amplifier.

A further feature is that the signal source connected with the input terminal of the amplifier is referred to the stable reference voltage.

Yet another feature of the invention is the method of operating the power supply and amplifier including the steps of establishing a reference potential which is stable with respect to one of the power supply terminals, and deriving an output signal from the amplifier, referred to the stable reference voltage and having an amplitude less than V1-V2.

Further features and advantages of the invention will readily be apparent from the following specification and from the drawings.

The invention is described primarily in terms of the combination of a power supply and a signal amplifier. It will be understood that the signal amplifier may perform one or more functions other than merely translating an input signal. The "amplifier" may be a filter, an oscillator, an amplitude or frequency modulator, etc. The important criteria are that a stable voltage reference is established with respect to one terminal of the bipolar power supply, that the amplifier output be referred to the stable voltage and that the amplifier output signal be limited in amplitude to a voltage range that is not subject to noise.

Figure 1:
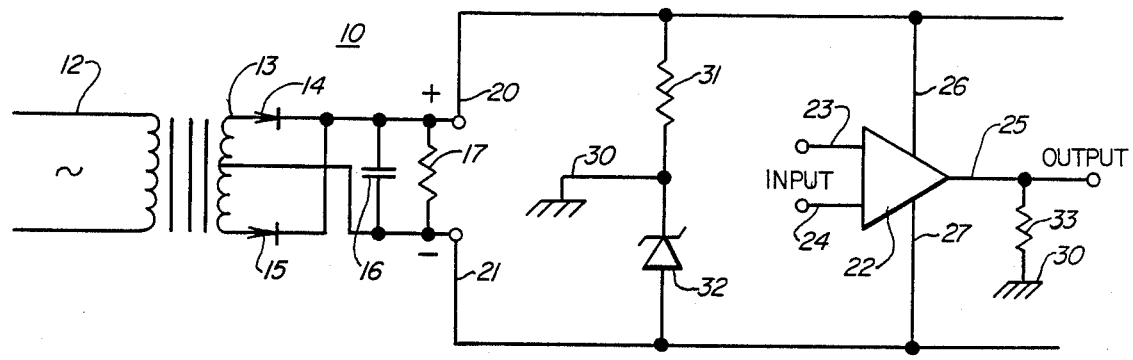
FIG. 1 is a schematic diagram of a power supply and amplifier illustrating the invention.

In FIG. 1 a power supply 10 includes a transformer 11 having a primary winding 12 connected with a source of AC power. Secondary winding 13 is connected with diodes 14, 15 in a full wave rectifier circuit. The DC output of the power supply is filtered by capacitor 16 and shunt resistor 17. Power supply 10 has a positive terminal 20 and negative terminal 21.

Bipolar amplifier 22 has a pair of signal input terminals 23, 24 and a signal output terminal 25. Positive and negative power terminals 26, 27 are connected with power supply terminals 20, 21, respectively.

In accordance with the invention, a stable or fixed reference voltage is established at the junction 30 of a resistor 31 and Zener diode 32 connected in series across the positive and negative terminals 20, 21 of power supply 10. The output of amplifier 22 is developed across load resistor 33 connected from amplifier output terminal 25 to the reference voltage 30.

Figure 2:
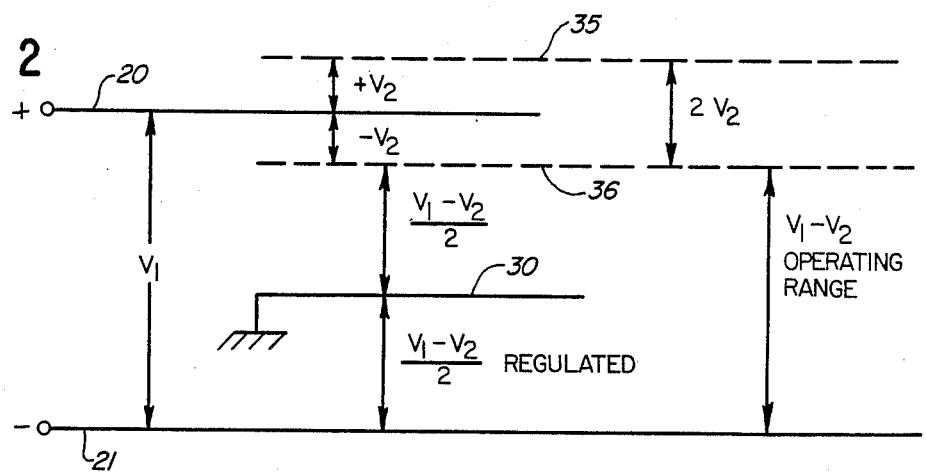
FIG. 2 is a voltage diagram illustrating the operation of the invention.

Voltage diagram of FIG. 2 illustrates operation of the power supply and amplifier. The voltage levels are identified by the same reference numerals as the power supply terminals. The voltage between the positive and negative power supply terminals 20, 21 is designated V1. This voltage is subject to variation of ±V2 illustrated by dashed lines 35, 36 above and below the positive terminal level 20. The stable reference 30 is regulated by Zener diode 32 to be above the negative terminal 21 by a voltage $$\frac{V1 - V2}{2}.$$

A voltage of $$\frac{V1 - V2}{2}$$

above reference 30 and below dashed line 36 is free of noise. As explained above, the output signal of amplifier 22 is referred to the stable reference 30 and has an amplitude within the V1-V2 operating range. Thus, although the voltage at terminal 20 varies with respect to the stable reference, the output signal is not subject to noise which is present in the 2 V2 zone between dashed lines 35 and 36.

The combination of power supply and amplifier as described affords stable, noise-free operation with a simple and inexpensive regulating network. It is not necessary that both halves of the bipolar power supply have filters and regulators in order to achieve a high signal-to-noise ratio.

The amplifier used in this circuit is preferably a dual input bipolar operational amplifier as an operational transconductance amplifier. A suitable device is the RCA type CA3280.

Figure 3:
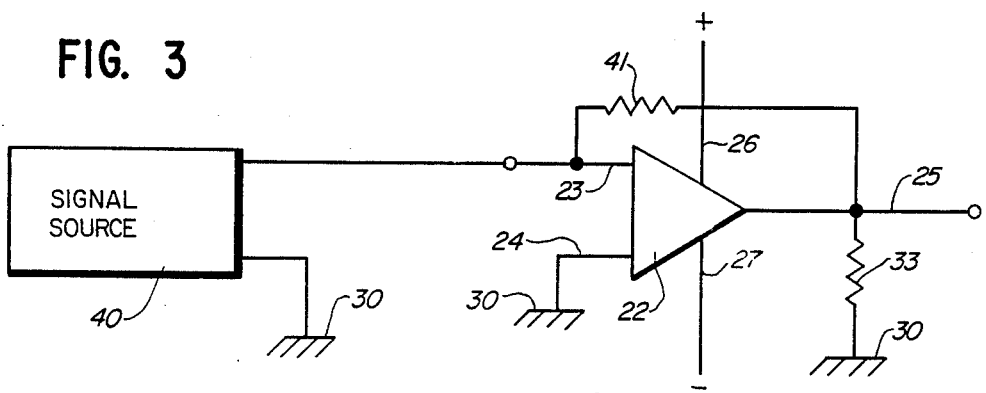
FIG. 3 is a schematic illustration of the amplifier and a single ended signal source.

In FIG. 3, amplifier 22 is shown in a circuit configuration suitable for operation with a single ended signal source 40, as in an audio amplifier. The signal source has one output terminal connected with one of the input terminals of amplifier 22. The other input terminal of signal source 40 is returned to the stable reference 30. Similarly, the second input terminal of amplifier 22 is returned to stable reference 30. The amplified output signal is developed at output terminal 25 across load resistor 33 which is returned to stable reference 30. A feedback resistor 41 is connected between amplifier output terminal 25 and the input terminal 23. The amplifier power terminals 26, 27 are connected with power supply terminals 20, 21 respectively as in FIG. 1.

Figure 4:
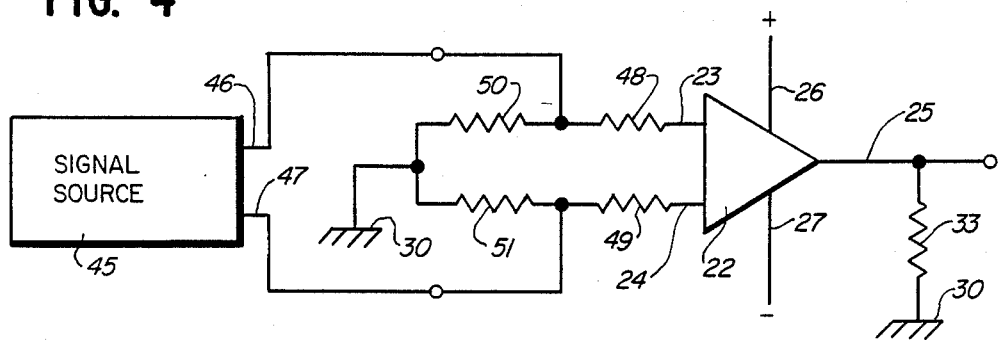
FIG. 4 is a schematic illustration of the amplifier and a double ended signal source.

FIG. 4 shows the amplifier 22 used with a double ended signal source 45. Such a signal source might, for example, be used in an audio intercommunication system having the audio lines balanced with respect to ground so that common mode interference cancels. The output terminals 46, 47 of signal source 45 are connected with the input terminals 23, 24 of amplifier 22 through series resistors 48, 49. A balanced network comprising resistors 50, 51 is connected from the signal source output terminals 46, 47 to the stable reference 30. Again, the output of amplifier 22 is developed at terminal 25 across load resistor 33 which is returned to stable reference 30. The positive and negative power terminals 26, 27 of amplifier 22 are connected with the power supply terminals 20, 21 as in FIG. 1.

Figure 5:
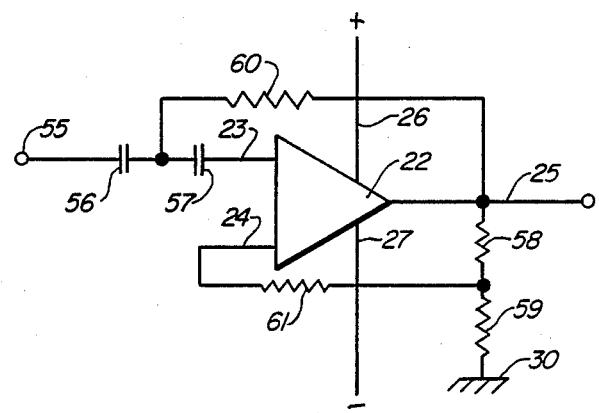
FIG. 5 is a schematic diagram of the amplifier operated as a filter.

FIG. 5 shows the amplifier 22 connected to operate as a filter. A signal from a source (not shown) is connected with terminal 55 and through series connected capacitors 56, 57 with amplifier input terminal 23. The amplifier output at terminal 25 is connected across a load comprising series connected resistors 58, 59 which are returned to the stable voltage reference 30. Feedback resistor 60 is connected from the amplifier output terminal 25 to the junction between capacitors 56, 57. Feedback resistor 61 is connected from the junction of load resistors 58, 59 to the amplifier input terminal 24. As in the previous circuits the amplifier power terminals 26, 27 are connected with power supply terminals 20, 21.

Figure 6:
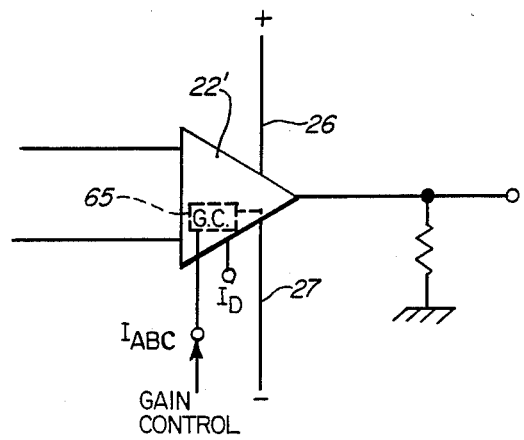
FIG. 6 is a schematic diagram of the amplifier incorporating means for controlling amplifier gain referred to the negative power terminal of the amplifier.

FIG. 6 illustrates diagrammatically an amplifier 22' having an internal gain control circuit 65. In the RCA 3280 amplifier mentioned above, this gain control function is provided by an amplifier bias circuit controlled by a current generally designated $I_{ABC}$. The gain control circuit is internally referred to the negative power terminal 27 of the amplifier. ④ Accordingly, for stable operation of the amplifier gain control circuit, it is necessary that the power supply have the stable reference voltage 30 established with respect to the negative power supply terminal 21, as shown in FIG. 1. The gain control input to amplifier 22' may be derived from manual control, an automatic gain control loop or an independent gain control source, depending upon the particular system in which the amplifier is used.

④ This amplifier also has linearizing diodes referred to the negative power terminal and driven by a current $I_D$ to control input impedance.

I claim:

1. A power supply and signal amplifier comprising:
   a bipolar DC power supply having a positive terminal and a negative terminal with a nominal voltage V1 therebetween, the voltage of said power supply being subject to variations or ripple of $\pm V2 < V1$;
   means establishing a stable reference voltage which is fixed with respect to one of said supply terminals, the voltage at the other power supply terminal being subject to variations or ripple of $\pm V2$ with respect to said reference voltage;
   an amplifier with input and output terminals and power terminals, the power terminals being connected with both the positive and negative power supply terminals;
   a signal source connected with the amplifier input terminal and with said stable reference voltage; and
   a signal output circuit connected with the amplifier output terminal and referred to said stable reference voltage, the amplitude of said amplified output signal being less than V1–V2.

2. The power supply and signal amplifier of claim 1 in which the amplifier is an operational amplifier.

3. The power supply and signal amplifier of claim 2 in which the amplifier is an operational transconductance amplifier.

4. The power supply and signal amplifier of claim 2 in which the amplifier has direct and inverting inputs and said signal source has a double ended output, the two signal source outputs being connected with the amplifier inputs, and including a balanced network connected from the two signal source outputs to the stable reference voltage.

5. The power supply and signal amplifier of claim 1 including a reactive element connected with said amplifier, the amplifier performing a filtering function.

6. The power supply and signal amplifier of claim 1 in which the means establishing a stable reference voltage includes a Zener diode having one terminal connected with one power supply terminal and a resistor connected between the other terminal of the Zener diode the other power supply terminal, the amplifier output signal being referred to the connection between the Zener diode and resistor.

7. The power supply and signal amplifier of claim 1 in which said signal source is single ended and has an output terminal connected with the input terminal of said amplifier, said signal source and the input of the amplifier being referred to said stable reference voltage.

8. The power supply and signal amplifier of claim 1 in which the amplifier includes means providing a gain control which is referred to the negative amplifier power terminal, and in which the stable reference voltage is stable with respect to the negative power supply terminal.

9. The power supply and signal amplifier of claim 1 in which the stable reference voltage is fixed with respect to said one supply terminal at a value of the order of $$\frac{V1 - V2}{2}.$$

10. In a bipolar DC power supply and signal amplifier, the power supply having a positive terminal and a negative terminal with a nominal voltage V1 therebetween, the voltage of said power supply being subject to variations of $\pm V2$ where $V2 < V1$, and the amplifier has input and output terminals and power terminals, the power terminals being connected with both the positive and negative power supply terminals, the method of operation comprising:

establishing a stable reference voltage which is fixed with respect to one of said supply terminals, the voltage at the other of said power supply terminals varying with respect to said stable reference voltage;

providing a signal to said amplifier input; and deriving an output signal from the amplifier output terminal, said output signal being referred to said stable reference voltage and the amplitude of said amplified output signal being less than V1−V2.

* * * * *